(12) United States Patent
Huber et al.

(10) Patent No.: US 8,054,120 B2
(45) Date of Patent: Nov. 8, 2011

(54) INTEGRATED CIRCUIT OPERABLE IN A STANDBY MODE

(75) Inventors: Manfred Huber, Griesstaett (DE); Peter Heinrich, Rosenheim (DE)

(73) Assignee: STMicroelectronics Design & Application GmbH, Grasbrunn (DE)

( * ) Notice: Subject to any disclaimer, the term of this patent is extended or adjusted under 35 U.S.C. 154(b) by 170 days.

(21) Appl. No.: 12/495,476

(22) Filed: Jun. 30, 2009

(65) Prior Publication Data

US 2010/0327960 A1    Dec. 30, 2010

(51) Int. Cl.
*G05F 1/46*    (2006.01)
*H03K 17/30*    (2006.01)

(52) U.S. Cl. ........ 327/198; 327/544; 323/901; 307/130; 365/229

(58) Field of Classification Search .................. None
See application file for complete search history.

(56) References Cited

U.S. PATENT DOCUMENTS

| | | | | |
|---|---|---|---|---|
| 6,021,082 A * | 2/2000 | Shirai | | 365/226 |
| 6,954,103 B2 * | 10/2005 | Yamauchi et al. | | 327/540 |
| 7,659,773 B2 * | 2/2010 | Choi et al. | | 327/544 |
| 7,750,729 B2 * | 7/2010 | Lee et al. | | 327/544 |
| 2005/0232053 A1 * | 10/2005 | Azuma et al. | | 365/226 |

* cited by examiner

*Primary Examiner* — Lincoln Donovan
*Assistant Examiner* — Terry L Englund
(74) *Attorney, Agent, or Firm* — Lisa K. Jorgenson; Robert Iannucci; Seed IP Law Group PLLC

(57) ABSTRACT

An integrated circuit, comprises a wakeup terminal; a supply voltage terminal configured to receive a supply voltage; and a power control circuit. The power control circuit comprises an enable circuit coupled to the wakeup terminal and configured to generate a voltage monitoring enable signal as a response to a wakeup signal received at the wakeup terminal, and a voltage monitoring circuit for generating a supply voltage level indication signal. The voltage monitoring circuit is coupled to the supply voltage terminal and comprises an operation switch controlled by the voltage monitoring enable signal. The voltage monitoring circuit is configured to determine if the supply voltage is above a threshold voltage and set the supply voltage level indication signal accordingly. The integrated circuit further comprises processing circuitry, with the supply voltage level indication signal controlling the switching between a normal operation state and a standby state of the processing circuitry.

29 Claims, 3 Drawing Sheets

INTEGRATED CIRCUIT OPERABLE IN A STANDBY MODE

BACKGROUND

1. Technical Field

The present disclosure relates to an integrated circuit that is operable in a standby state.

2. Description of the Related Art

Modern highly-developed machines rely on electronic control in an ever increasing manner. Particularly, in the automotive industry, the number of integrated circuits per vehicle has increased drastically. Integrated circuits control and provide electric power to a wide variety of components, devices and applications. For example, electric motors for power window systems, in-vehicle lighting fixtures, electronic door locking means, seat heating, means for electronic rear-view mirror motion, etc. are commonly driven and controlled by integrated circuits. Communication of these integrated circuits with sensors, control units and other devices is commonly achieved over a communication bus. The integrated circuits are usually coupled to the communication bus, sometimes via an intermediate microcontroller. These integrated circuits are usually supplied with electric power from the car battery, either directly or indirectly via a voltage transformer or other power regulating device. To ensure error-free functionality of the logic circuits disposed on the integrated circuits, the voltage supplied by a power source should be above a defined threshold voltage. Many integrated circuits therefore comprise circuitry for checking the supplied voltage level.

In order to save power, many integrated circuits are operable either in a normal operation state or in a standby state. In the automotive environment, the standby state is for example entered when the vehicle is turned off, because the car battery is not being recharged. However, it is desirable to have various functions or devices working, when the vehicle is turned off. For example, the door locking mechanism, the power window systems, the in-vehicle lights, etc. are kept operable when the car is turned off. However, for the integrated circuits, which drive these devices, to correctly respond to commands from the communication bus of the vehicle, the circuitry checking the voltage level of the power source is in operation when the car is turned off. As this voltage checking circuitry draws electric power from the car battery, these integrated circuits play a substantial role in continuously discharging the car battery, which can lead to the highly undesirable case of the car battery being fully discharged and the car not being operable by a user after the car has not been used for an extended period of time.

Accordingly, it would be beneficial to provide an integrated circuit that has reduced power dissipation in a standby state.

BRIEF SUMMARY

According to an embodiment, an integrated circuit that is operable in a standby state comprises at least one wake-up terminal, a supply voltage terminal coupleable to an external power source providing a supply voltage and a power control circuit. The power control circuit comprises an enable circuit for generating a voltage monitoring enable signal, wherein the enable circuit is coupled to the at least one wake-up terminal and is configured to set the voltage monitoring enable signal as a response to a wakeup signal received at the at least one wake-up terminal, and a voltage monitoring circuit for generating a supply voltage level indication signal, the voltage monitoring circuit being coupled to the supply voltage terminal and comprising an operation switch controlled by the voltage monitoring enable signal, wherein the voltage monitoring circuit is configured to determine if the supply voltage is above a predetermined threshold voltage and to set the supply voltage level indication signal accordingly. The integrated circuit further comprises processing circuitry for processing an input signal, with the supply voltage level indication signal controlling the switching between a normal operation state and a standby state of the processing circuitry.

This integrated circuit allows for a very low power dissipation in a standby state. As the voltage monitoring circuit comprises an operation switch, i.e. an on-off switch, the power dissipation of the voltage monitoring circuit in the standby state can be completely eliminated. As a consequence, the supply voltage level indication signal does not indicate to the processing circuitry to enter an operation state, such that the processing circuitry may remain in a standby state, where it does not dissipate any electrical power, either. Consequently, only the enable circuit dissipates electric power, when the integrated circuit is in the standby state. As the enable circuit is reduced to providing a switching signal to the voltage monitoring circuit in response to a wakeup signal received at the at least one wakeup terminal, the overall energy used by the integrated circuit in the standby state is extremely low. In exchange for a slight modification of the communication protocol used for sending input signals, which can also be referred to as communication signals or command signals, to the integrated circuit, e.g. by a communication bus or by a microcontroller, the modification being that a wakeup signal is sent before communication signals to be processed are transmitted to the integrated circuit, a standby state with almost zero standby current is achieved.

The input signals may, in operation, be received by a subset of the at least one wakeup terminal. This subset may be any kind of subset from one to all of the at least one wakeup terminal. In this way, the wakeup signal and the commands to the integrated circuit, may be supplied to the same terminal(s), which allows for a reduced number of terminals used by the integrated circuit. In a particular case, the wakeup signal and the commands to the processing circuitry may be transmitted over one single communication line and one single terminal. It is also possible that the integrated circuit comprises at least one communication terminal, with the input signal, in operation, being received at the at least one communication terminal. It can be also thought about a hybrid solution, with the input signal being partially received at a subset of the at least one wakeup terminal and being partially received at the at least one communication terminal. Seen from outside of the integrated circuit, this allows for using one or more of the at least one wakeup terminal and the at least one communication terminal to transmit commands to the processing circuitry of the integrated circuit, which allows for an increased number of design options.

In a further embodiment, the power control circuit comprises an enable hold circuit for generating an enable hold signal and providing the enable hold signal to the enable hold circuit, such that the voltage monitoring enable signal is set as a response to the enable hold signal. By providing an enable hold circuit capable of generating an enable hold signal, it is achieved that a wakeup pulse supplied to one of the at least one wakeup terminal is sufficient for bringing the integrated circuit from the standby state to the normal operation state. After the duration of the wakeup pulse, the hold enable circuit ensures that the operation switch of the voltage monitoring circuit stays closed and that, as a consequence, the processing circuitry stays in the normal operation state, given that the supply voltage is above the predetermined threshold voltage. In other words, the supply of a set wakeup signal or a set enable hold signal may result in a set voltage monitoring enable signal. Using only a wakeup pulse allows for a more flexible implementation of the control of the integrated circuit, as no continuous enable signal is required. This has the additional advantage that the at least one wakeup terminal may be used for other purposes, for example communication purposes, as well.

In another embodiment, the enable hold circuit comprises an enable register coupled, with a content of the enable register being set in response to the input signal and the content of the enable register being processed in generating the enable hold signal. With this structure, the command signals to be processed by the processing circuitry, which may be received at the at least one communication terminal or at a subset of the at least one wakeup terminal or a combination thereof, are also processed by the power control circuit. The processing of these signals may result in a decision if the integrated circuit is to be put/kept in the normal operation state or in the standby state. A value indicating said decision can be saved in the enable register, such that the enable hold signal, which is based on the value stored in the enable register, may be seen as the switching signal between the normal operation state and the standby state. This structure eliminates the need for a dedicated switching signal applied to the integrated circuit from an external source. The enable register may be a digital register, with the value stored therein being a binary value indicating one of the two switching states of the normal operation state and the standby state.

According to a further embodiment, the enable hold circuit comprises a timer circuit coupled to the at least one wakeup terminal, with the timer circuit being triggered by the wakeup signal received at the at least one wakeup terminal and the enable hold signal being set in response to a status of the timer circuit. The timer circuit allows for the transition of the integrated circuit from the standby state to the normal operation state to be initiated by a short wakeup pulse. As the timer circuit may be started by that wakeup pulse, it may supply an enable hold signal for a defined period of time. This results in the voltage monitoring enable signal keeping the operation switch of the voltage monitoring circuit closed for such a time period that the supply voltage check may be carried out and some or all portions of the integrated circuit, e.g. the processing circuitry and the enable register, may be brought into a defined initial state. In this defined initial state, they are ready to react to input signals at the at least one communication terminal and/or at the at least one wakeup terminal in an expected manner. Also, for the transition from the normal operation state to the standby state of the integrated circuit, the timer circuit may ensure that the voltage supply to some or all portions of the integrated circuit lasts for a defined period of time, after the standby command signal has been received. As a consequence, the registers, circuit logic, switches, etc. of the integrated circuit may have enough time to enter a predefined standby state. For this purpose, the timer circuit may be coupled to the enable register in order to receive information about a standby command received at the at least one communication terminal.

As indicated above, a portion or all of the at least one wakeup terminal may be adapted to receive command signals to be processed by the processing circuitry as well. This structure allows for reducing the number of terminals of the integrated circuit, and therefore for making the integrated circuit more compact.

BRIEF DESCRIPTION OF THE SEVERAL VIEWS OF THE DRAWINGS

Embodiments are described in greater detail below with reference to the figures, wherein.

DETAILED DESCRIPTION

Figure 1:
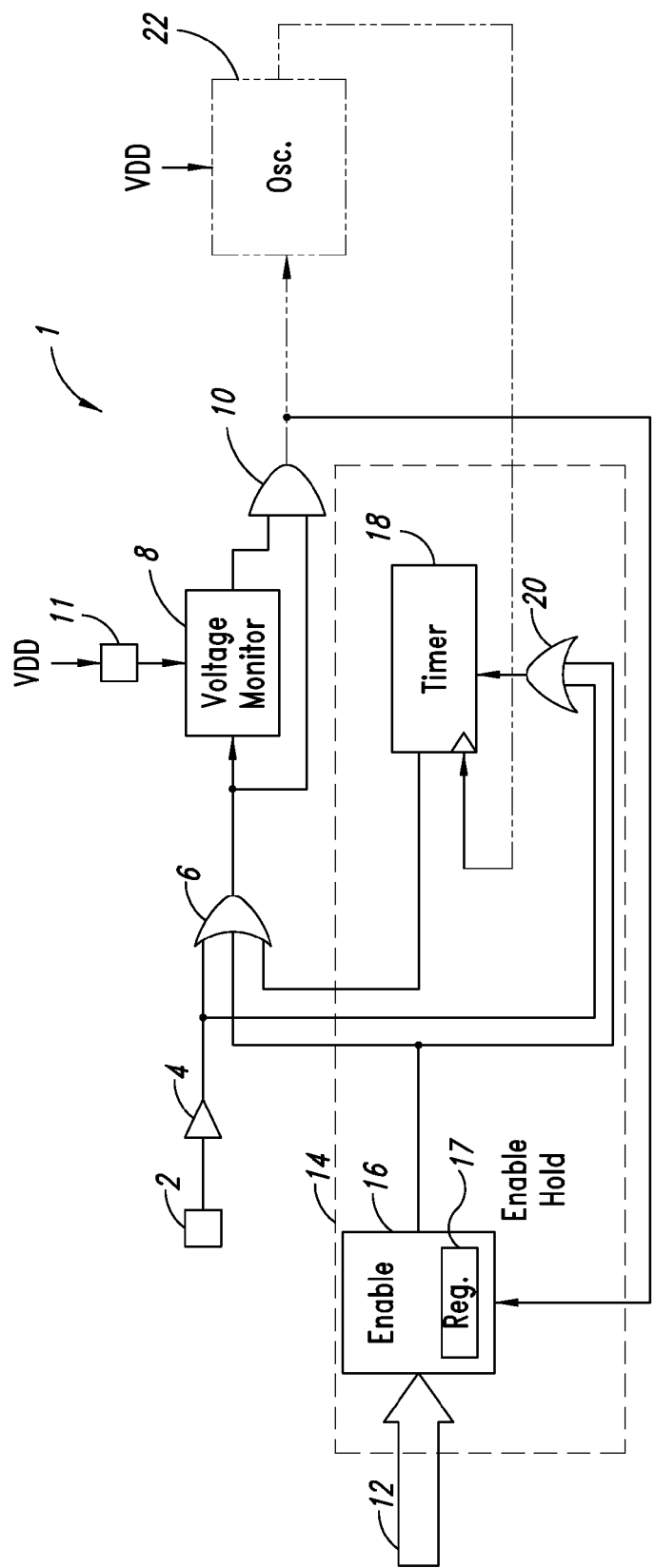
FIG. 1 shows a block diagram of a power control circuit comprised in an integrated circuit in accordance with an embodiment.

FIG. 1 shows an exemplary embodiment of a power control circuit 1 comprised in an integrated circuit 50 (shown in FIG. 2) according to an embodiment of the present disclosure.

A wakeup terminal 2, which, strictly speaking, is not part of the power control circuit 1, but of the integrated circuit 50, is connected to a driver 4. The output of the driver 4, which is an optional component, is connected to the enable circuit 6. In the embodiment of FIG. 1, the enable circuit 6 is implemented as an OR-gate. The output of the OR-gate 6 is connected to a voltage monitoring circuit 8 as well as to an AND-gate 10. The voltage monitoring circuit 8 is supplied with a supply voltage VDD. Said supply voltage VDD is supplied by an external power source (not shown) connected to a supply voltage terminal 11 of the integrated circuit. The output of the voltage monitoring circuit 8 is connected to the AND-gate 10.

Figure 2:
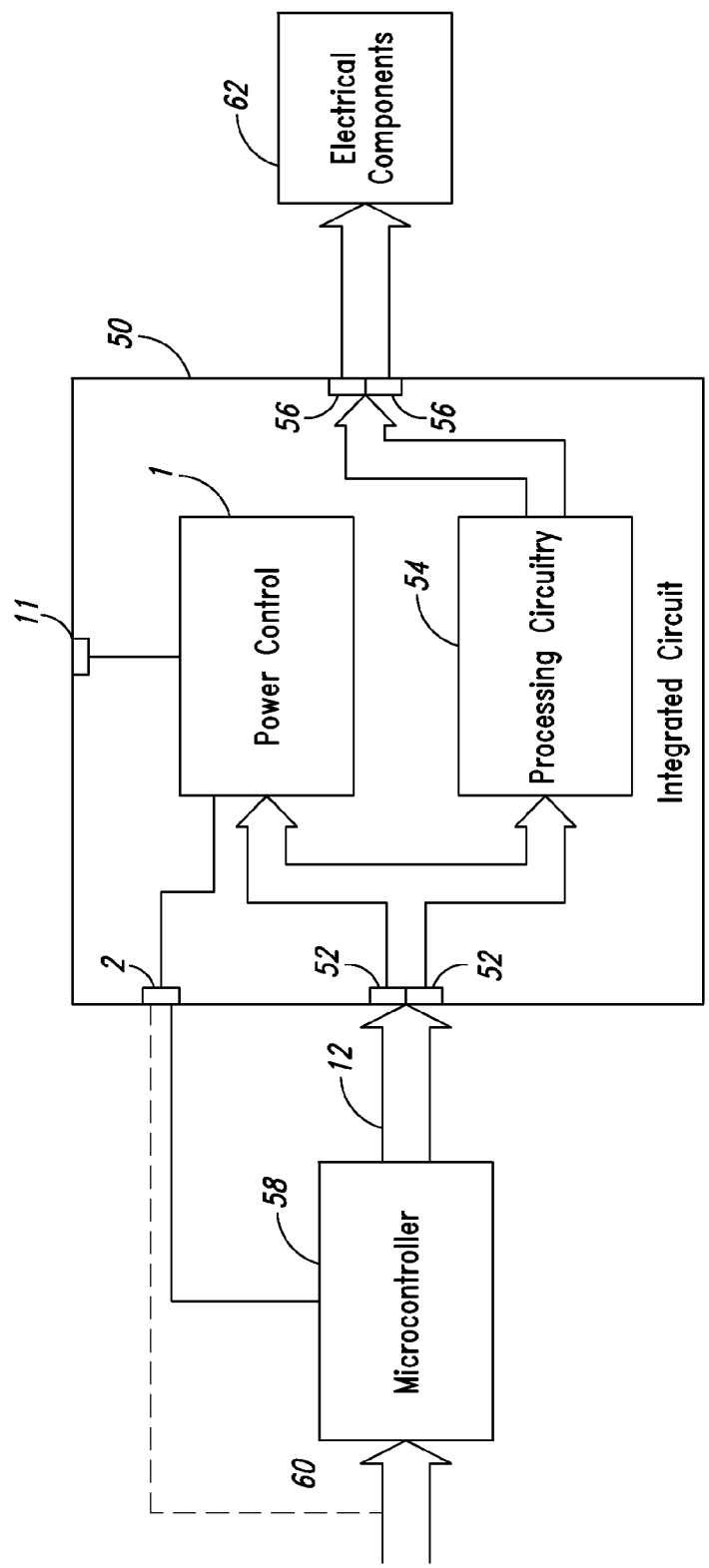
FIG. 2 is a block diagram of a systems including an integrated circuit with a power control circuit.

The power control circuit 1 of FIG. 1 also comprises an enable hold circuit 14, which in turn comprises an enable register circuit 16, a timer circuit 18, and an OR-gate 20. The enable register circuit 16 is provided with input signal 12 received by the integrated circuit 50 at a plurality of communication terminals 52 (FIG. 2). The width of the arrow 12 in FIG. 1 illustrates a generic communication interface. It may be implemented as a parallel interface or a serial interface or a parallel serial interface. In the embodiment of FIG. 1, the plurality of communication terminals of the integrated circuit are an implementation of a serial parallel communication interface. The output of the enable register circuit 16 is connected to the OR-gate 6 as well as to the OR-gate 20. The output of the driver 4 is also connected to the OR-gate 20. The output of the OR-gate 20 is connected to the timer circuit 18. The output of the timer circuit 18 is connected to the OR-gate 6. The output of the AND-gate 10 is connected to the enable register circuit 16 as well as to an oscillator 22. The oscillator 22 is supplied with the supply voltage VDD from the supply voltage terminal of the integrated circuit 50. Its output is connected to the timer circuit 18.

An exemplary greater system context of the power control circuit 1 is shown in FIG. 2. The power control circuit 1 is comprised in the integrated circuit 50, which comprises processing circuitry 54 for processing input signals, received for example at the plurality of communication terminals 52. The processing circuitry 54 generates one or more output signals or provides one or more output terminals 56 with requested voltage levels. The input signal 12 received at the plurality of communication terminals 52 is provided by a microcontroller 58, which in turn receives commands/requests from a communication bus 60, such as a CAN-bus. The wakeup terminal 2 may be connected to the microcontroller 58 or to the communication bus 60 directly. The output terminals 56 of the integrated circuit 50 are connected to electric components 62. In the particular embodiment described, the integrated circuit 50 supplies the electric components 62 with electric power, the manner and time periods of power supply being determined by the commands received at the communication terminals 52.

The operation of the power control circuit 1 is described as follows. When a wakeup command is received at the wakeup terminal, with the wakeup command being a particular voltage level supplied to the wakeup terminal 2, the driver 4 amplifies the wakeup signal and supplies a logic one signal to the enable circuit 6. As the enable circuit 6 is an OR-gate, it outputs a logic one signal as a response to receiving a logic one signal from the driver 4. Said signal output by the OR-gate 6 is the voltage monitoring enable signal, which is supplied to the voltage monitoring circuit 8 and the AND-gate 10. In the voltage monitoring circuit 8, which is assumed to have been in an off/standby-state, the logic one of the voltage monitoring enable signal closes an operation switch of the voltage monitoring circuit 8. By closing the operation switch, the voltage monitoring circuit 8 is brought into a normal operation state. The voltage monitoring circuit then determines if the supply voltage VDD is above a predetermined threshold voltage.

This comparison may be carried out in a lot of different implementations. An exemplary implementation comprises a voltage reference generating circuit and a voltage divider comprising two resistors connected in series. The supply voltage VDD is connected to the voltage divider. The voltage at the middle point of the two series resistors of the voltage divider is compared to the generated voltage reference by an operational amplifier. The output of the operational amplifier is the supply voltage level indication signal, which can have one of two states, depending on the comparison carried out in the operational amplifier. Hence, the output of the operational amplifier is indicative of the supply voltage VDD being above a predetermined threshold voltage or below a predetermined threshold voltage. This supply voltage level indication signal is the output of the voltage monitoring circuit 8. As a number of implementations of voltage reference generating circuits are known to a person skilled in the art, a discussion of such is omitted for brevity.

The supply voltage level indication signal is supplied to the processing circuitry 54, where it determines if the processing circuitry is in a normal operation state or in a standby state. If the supply voltage level indication signal indicates that the supply voltage VDD is above the predetermined threshold voltage, the processing circuitry 54 enters the normal operation state. On the other hand, if the supply voltage level indication signal indicates that the supply voltage is below the predetermined threshold voltage, the processing circuitry 54 remains in the standby state. As the desired behavior of the processing circuitry 54 may only be guaranteed when the supply voltage is above the predetermined threshold voltage, the overall decision between the normal operation state and the standby state is made dependent on the supply voltage level. The processing circuitry may be adapted in a way to not dissipate any electric power when in the standby state. For example, the supply voltage level indication signal may control a global on-off switch for the processing circuitry 54.

Additionally, the supply voltage level indication signal may be supplied to the enable hold circuit 14 and the oscillator 22, such that the enable register circuit 16 and the timer circuit 18 enter a normal operation state, with their proper function being ensured by the supply voltage VDD being above the predetermined threshold voltage. The logic one generated by the driver 4 as a response to the wakeup signal is supplied to the OR-gate 20. Consequently, a logic one signal is supplied to timer circuit 18 by OR-gate 20. The output of the timer circuit 18 is an enable hold signal. In the particular embodiment of FIG. 1, the timer circuit 18 may be implemented in a way to output a logic one signal as the enable hold signal, when it receives a logic 1 signal from OR-gate 20. When the input signal to the timer circuit 18 assumes a logic 0 state, the timer circuit is triggered. For a defined time period, the timer circuit output is kept at a logic one state. After the expiration of that defined time period, the enable hold signal output by the timer circuit 18 is set to a logic zero state. Accordingly, none of the wakeup signal and the enable hold signal output by the timer circuit 18 have a logic one state, such that the OR-gate 6 will set the voltage monitoring enable signal to a logic zero state, which in turn results in the voltage monitoring circuit and the processing circuitry returning to their standby states. With this timer functionality, it is achieved that the integrated circuit 50, particularly the voltage monitoring circuit 8 and the processing circuitry 54, stay in their normal operation states for the defined time period after the end of the wakeup pulse received by the wakeup terminal 2. Accordingly, the microcontroller 58 or communication bus 60 generating the wakeup pulse may supply only a very short wakeup pulse, with the integrated circuit remaining in the normal operation state for at least the predefined time period set by the timer circuit 18. That defined time period may be in the range of 0.1 to 10 ms, more preferably in the range between 0.5 to 5 ms, even more preferably around 1 ms. However, other values for the defined time period are possible and may be chosen depending on the gate and processing latency times in the power control circuit.

As soon as the enable register circuit 16 is brought into a normal operation state, the enable register circuit 16 processes the input signals 12 received at the plurality of communication terminals 52. The enable register circuit 16 determines if the input signals contain commands to the processing circuitry 54. In such a case, an enable register 17 comprised in the enable register circuit 16 is set to a value that results in an enable hold signal, which is supplied by the enable register circuit 16 to the OR-gate 6, having a logic one state. Hence, the voltage monitoring circuit and, as a consequence, the processing circuitry are kept in their normal operation states, irrespective of the signal received at the wakeup terminal and the enable hold signal generated by the timer circuit 18. Subsequently, the normal operation of the integrated circuit 50 is carried out, wherein input signals received at the plurality of communication terminals 52 are processed by the processing circuitry 54 and requested output signals are generated at the output terminals of the integrated circuit.

This behavior is maintained until the supply voltage VDD drops below the predetermined threshold voltage or a standby command is received at the plurality of communication terminals 52. In case the supply voltage VDD drops below the predetermined threshold voltage, the supply voltage level indication signal indicates said drop and forces the integrated circuit 50 into the standby state. In case the input signal 12 contains a standby command, the enable register will be set to a value that results in the output signal of the enable register circuit 16 having a logic zero state. However, this does not result in an immediate transition to the standby state of the integrated circuit 50. The timer circuit 18 does not only keep its output at a logic one state due to a logic one state provided by the driver 4, but also as a response to a logic one state provided by the enable register circuit 16, with the circuit logic for that being provided by OR-gate 20. Accordingly, in analogy to the timer circuit 18 being triggered by the wakeup signal ending, the output signal of the enable register circuit 16 assuming a logic zero state results in the enable hold signal output by the timer circuit 18 maintaining a logic one state for the defined time period before going into a logic zero state. Through this structure of the timer circuit 18 being coupled to the enable register circuit 16 and taking the content of the enable register into account for generating the enable hold signal, it is ensured that the integrated circuit is supplied with electric power for a transition period after the standby command is received. As a consequence, the processing circuitry 54, which receives the standby command from the plurality of communication terminals 52, may bring the output signals and all internal circuit components into a predefined standby state, from which a controlled transition into the normal operation state is possible at a later point in time. Accordingly, controllable and predictable transition behavior is achieved via this power down "grace period".

As also shown in FIG. 1, the output of AND-gate 10 is provided to oscillator 22 as an oscillator enable signal. In response thereto, the oscillator starts generating an internal clock signal provided to the timer circuit 18, based on which the timer circuit 18 is allowed to measure the defined time period. Alternatively, the timer circuit 18 may comprise internal clock signal generating means. It is pointed out that other delay generating mechanism might be suitable for the functionality of the timer circuit 18. In other words, the functionality of measuring a predefined time period is not restricted to the embodiment of a timer with a clock.

The output of AND-gate 10 may also be provided to enable register circuit 16 as a reset signal. When the output of the AND-gate 10 is at a logic zero state, i.e. when the output of the AND-gate indicates that the supply voltage VDD is below the predetermined threshold, the enable register is brought into a pre-defined reset state, as the integrated circuit as a whole will be forced into the standby state. This output signal of the AND-gate may be used as a reset signal to further components of the integrated circuit 50, in particular to the timer circuit and particular components or all of the processing circuitry 54, as this will allow the integrated circuit to go into a defined standby state for the case of a sudden supply voltage drop below the predetermined threshold voltage. As a consequence, start-up of the integrated circuit 50 via a wakeup pulse received at the wakeup terminal 2 will start from a known standby state and therefore work correctly and predictably.

Figure 3:
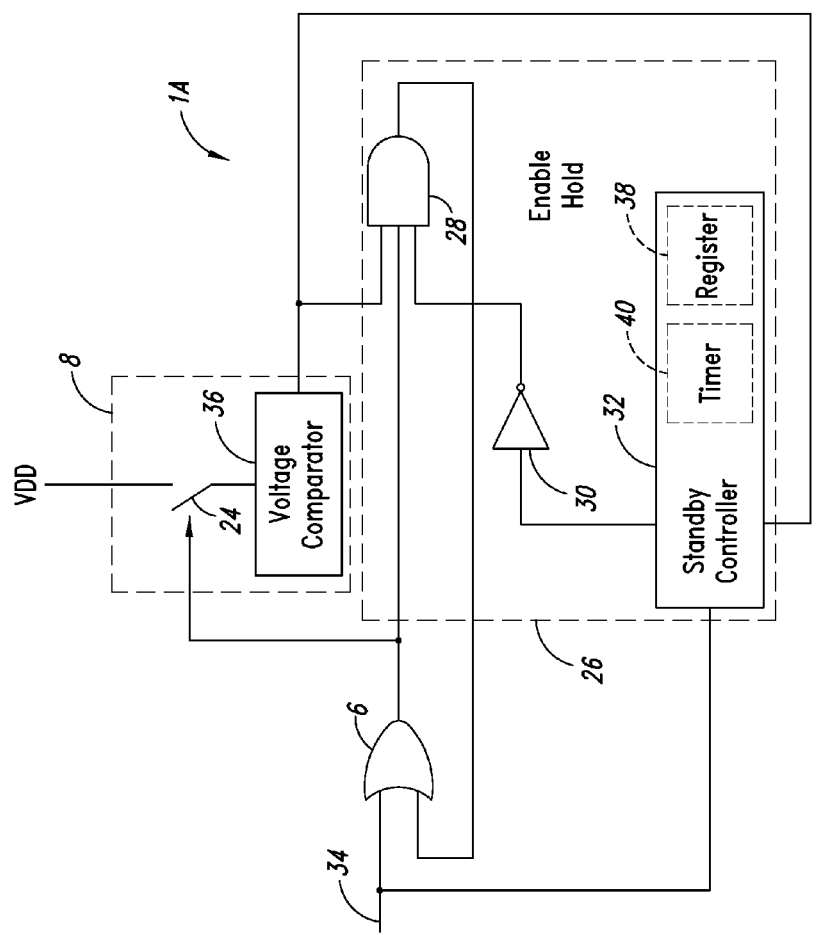
FIG. 3 shows a block diagram of a power control circuit comprised in an integrated circuit in accordance with another embodiment.

FIG. 3 shows another embodiment of a power control circuit 1A comprised in an integrated circuit in accordance with another embodiment. Components equal to components in FIG. 1 have been provided with the same reference numerals.

The power control circuit 1A of FIG. 3 comprises an enable circuit 6, to which an input signal line 34 is connected. The enable circuit 6 is an OR-gate, whose output, which is the voltage monitoring enable signal, is supplied to an operation switch 24 and to an AND-gate 28. The operation switch 24 belongs to a voltage monitoring circuit 8. The voltage monitoring circuit 8 also comprises a voltage comparison circuit 36. The operation switch 24 is interposed between a voltage supply terminal of the integrated circuit and the voltage comparison circuit 36. An external power source providing a supply voltage is connected to the supply voltage terminal of the integrated circuit. The output of the voltage comparison circuit 36, which carries the supply voltage level indication signal, is coupled to the AND-gate 28. The AND-gate 28 is part of an enable circuit 26, which also comprises a standby control circuit 32 and an inverter 30. The output of the AND-gate 28 is connected to the OR-gate 6. The input signal line 34 is also connected to the standby control circuit 32, whose output is connected to the inverter 30, whose output in turn is connected to the AND-gate 28. Also, the output of the voltage monitoring circuit 36 is connected to the standby control circuit 32.

The operation of the standby control circuit of FIG. 3 is described as follows. It is assumed that, at an initial point in time, the integrated circuit is in a standby state and that the output of the standby control circuit 32 is at a logic zero state, which means that the output of the inverter 30 is at a logic one state.

The input signal line may be a serial interface or a parallel interface or a so-called serial parallel interface, which carries a plurality of time-variant signals in parallel, so that the amount of information to be transmitted over the serial parallel interface is a function of the number of parallel signal lines and the information transmission rate per signal line. A plurality of different implementations of data interfaces are known to a person skilled in the art and may be used. In the exemplary embodiment of FIG. 3, the signal input line 34 is a serial parallel interface having 4 individual signal lines in parallel. One of these individual signal lines is connected to the enable circuit 6, with the wakeup signal being transmitted over this one signal line, whereas all four individual signal lines are connected to the standby control circuit 32. It is pointed out that many different embodiments of interfaces may be implemented. For example, a chip select line may be brought to a defined state, e.g. may be pulled low, as a defined wakeup signal, with the communication to the processing circuitry starting at the next clock cycle or any other defined time period later. Through a suitable protocol, the start of a communication may be sensed and used to wake up the integrated circuit.

In the embodiment of FIG. 3, a logic one pulse at the individual signal line connected to the OR-gate 6 is a suitable wakeup signal. The voltage monitoring enable signal output by the OR-gate 6 is set to a logic one value as a consequence. Via operation switch 24, which is controlled by the voltage monitoring enable signal, the voltage monitoring circuit 8 is brought into a normal operation state. As discussed with regard to the embodiment of FIG. 1, the voltage comparison circuit 36 compares the supply voltage VDD to a predetermined threshold voltage and outputs a supply voltage level indication signal indicative of the comparison. In case the supply voltage VDD is above the predetermined threshold voltage, the supply voltage level indication signal has a logic one state. As the output of the OR-gate 6 and the output of the inverter 30 carry signals with a logic one state, the output of the AND-gate 28 is also at a logic one state. As the output of the AND-gate 28 is the output of the enable hold circuit 26 carrying the enable hold signal, the enable hold signal is at a logic one state. As a consequence, the output of the enable circuit, i.e. the voltage monitoring enable signal, will stay at a logic one state due to the feedback path between the voltage monitoring circuit 8 and the enable circuit 6, irrespective of the signal supplied at the one individual signal line connected to the OR-gate 6. In other words, an automatic enable hold function is implemented via a feedback circuitry, such that the integrated circuit, particularly the processing circuitry, will be kept in the normal operation state, unless the supply voltage VDD drops below the predetermined threshold voltage or the standby control circuit 32 actively outputs a standby request.

In the embodiment of FIG. 3, the standby control circuit 32 receives input signals from the plurality of communication terminals. These input signals are also provided to the processing circuitry 54, with the processing circuitry reacting to the commands received as input signals. Accordingly, the standby control circuit 32 may be adapted to evaluate what functions the processing circuitry is carrying out. As a consequence, the standby control circuit may decide whether to issue a standby request signal or not. A logic one state at the output of the standby control circuit 32 leads to a logic zero state at the output of the inverter 30, which in turn leads to the enable hold signal, i.e. the signal output by the AND-gate 28, having a logic zero state. As a consequence, the output of the OR-gate 6 has a logic zero state (assuming that no logic one state is provided by the one of the signal input lines 34 connected to the OR-gate 6), which brings the voltage monitoring circuit 8 and, as a consequence, the processing circuitry in their standby states. In short, the standby control circuit 32 is capable of having such an influence on the enable hold signal that the integrated circuit may be brought into the standby state.

The standby control circuit 32 may comprise a variety of different circuit elements to accomplish the goal of effectively influencing the enable hold signal and the switching of the integrated circuit from the normal operation state to the standby state. The standby control circuit may have an enable register 38, wherein a value is stored which indicates whether the standby state or the normal operation state is desired at a given moment. The enable register 38 may be comprised in or associated with an enable register circuit that evaluates the commands received from the plurality of communication terminals. When a standby command is received at the plurality of communication terminals, the enable register circuit sets the enable register 38 to a value indicating a standby command. As a response thereto, the signal output by the standby control circuit 32 may be set to a value indicating a standby request. For all other commands received at the plurality of communication terminals, the enable register 38 may be set to a value indicating that no standby command has been received.

Additionally/alternatively, the standby control circuit 32 may comprise a timer circuit 40. The timer circuit may have any combination of the functions discussed with respect to the timer circuit of FIG. 1. The timer circuit 40 may be adapted to prevent a standby request signal to be output by the standby control circuit 32 for a defined time period after a wakeup signal has been received at the input terminals. This function may also be looked at from another angle: after expiration of the defined time period, a standby request is output by the standby control circuit 32 in order to bring the integrated circuit back into the standby state, unless another event, such as the reception of more input signals, prevents said standby request. In other words, the timer circuit 40 may, on the one hand, be configured to give the integrated circuit sufficient time to transition from the standby state to the normal operation state and receive further input signals at the plurality of communication terminals. On the other hand, the timer circuit may be configured to initiate a transition back to the standby state if no input signals have been received for a defined time period after a wakeup signal or after another kind of command signal. Accordingly, a transition back to the standby state may be implemented regardless of a dedicated standby command being received at the plurality of communication terminals.

The timer circuit 40 may also be configured to delay the output of the standby request signal by the standby control circuit 32 with respect to the reception of the standby command at the input of the standby control circuit 32. In this way, it may be ensured that the remainder of the integrated circuit, particularly the processing circuitry, may be provided with the supply voltage for an extended transition time such that a controlled transition to the standby state can be achieved. The timer circuit 40 allows for controlled transition periods between the standby state and the normal operation state.

In a transition to the standby state (e.g. due to an undervoltage being detected by the voltage comparison circuit 36), the decoupling of the supply voltage VDD from the integrated circuit may be indicated by the provision of the supply voltage level indication signal to the standby control circuit 32. The supply voltage level indication signal may serve as a request signal to bring the standby control circuit 32 into a controlled standby state, from which it may be brought back into the normal operation state in a controlled and predictable manner.

It is noted that the input to the inverter 30, which is generated by the standby control circuit 32 in the embodiment of FIG. 3, could alternatively be generated outside the integrated circuit, for example in the microcontroller that is responsible for generating the command signals to the integrated circuit. It is possible that the functionality discussed in connection with the standby control circuit 32 is implemented outside the integrated circuit.

It is pointed out that the power control circuits of FIG. 1 and FIG. 3 may be used interchangeably, provided that the connections to the terminals and to the remaining circuitry are analogous, of course. The main difference between the two embodiments is the way the enable hold signal is generated. Whereas an "automatic" enable hold signal is generated via the feedback circuitry in the embodiment of FIG. 3, which can be interrupted by a standby request signal by the standby control circuit 32, the power control circuit 1 of FIG. 1 relies on an "active" enable hold signal being generated by either the enable register circuit 16 or the timer circuit 18, with no enable hold signaling from any of these two circuits resulting in the integrated circuit entering the standby state. Accordingly, the advantages and properties discussed above with regard to the embodiment of FIG. 1 or the embodiment of FIG. 3 are generally applicable to both embodiments.

A number of advantages, properties and modifications applicable to both embodiments described are given as follows. The signal flow into, within and out of the integrated circuit may rely on analog or digital signals. However, with the logic circuitry involved and the decision about the comparison between the supply voltage VDD and the predetermined threshold voltage determining the switching between two states, digital signal processing may be preferable in certain embodiments. As is apparent to a person skilled in the art, the logic circuits shown in the embodiments of FIG. 1 and FIG. 2 may have different implementations and may make use of other gate components, such as NOR-gates and NAND-gates. Also, the direct connection between the OR-gate 6 and the AND-gates 10 and 28, respectively, may be dispensed of in particular embodiments.

As discussed above, the voltage monitoring circuit 8 may comprise a voltage divider. For a particular compact layout of the power control circuit, the resistors of the voltage divider may be chosen to have low resistance values. This leads to an increased power dissipation in the voltage divider when the operation switch of the voltage monitoring circuit is closed. However, as this switch is only closed in a normal operation state, the power dissipation of the integrated circuit in the standby state is unaffectedly low.

The integrated circuit may be a packaged integrated circuit with the terminals being pins of the integrated circuit package. A low number of terminals accordingly leads to a low number of pins, which is advantageous for the compact nature of the integrated circuit according to the invention.

The enable circuit is the only component of the integrated circuit that is in an operable state when the integrated circuit as a whole is in a standby state. With the voltage monitoring circuit being in a standby state, the enable circuit is supplied with a supply voltage, whose quality, in terms of being above the predetermined threshold voltage, is not monitored. Consequently, it can be thought of circumstances when the enable circuit outputs a wrong voltage monitoring enable signal, e.g. a logic 1 state indicating a wakeup event, even if no wakeup signal had been received at the wakeup terminal or the communication terminal(s) connected to the enable circuit. However, such a false wakeup event does not have a big impact on the integrated circuit. As the voltage comparison is carried out as a direct response, an undervoltage will lead to the integrated circuit remaining in the standby state. And in the case of the supply voltage VDD having the required voltage level, the enable hold circuit will provide for causing a timely return of the integrated circuit into the standby state.

Even though it has been presented as advantageous that one or more of the at least one wakeup terminal is(are) used as communication terminal(s), it is pointed out that the integrated circuit may comprise a dedicated wakeup terminal only adapted to receive wakeup signals. It is also possible that the integrated circuit comprises an on-off terminal, with the signal supplied to the on-off terminal constantly indicating if the integrated circuit should be in the normal operation state or in the standby state at the given point in time.

With regard to FIG. 1, it has been shown that the enable hold circuit 14 may output two enable hold signals. However, with according circuit logic, these two signals could be reduced to one enable hold signal. An example of such a circuit logic would be an OR-gate comprised in the enable hold circuit 14, with the output of the enable register circuit 16 and the timer circuit 18 being inputs to that additional OR-gate. Then, the enable hold circuit would only have one output, namely the output of the additional OR-gate, supplied to the enable circuit 6. Accordingly, the singular form of the term enable hold signal, as well as of the other signals defined, shall not be understood in a limited way, for example in a way that there is only one signal line present. The term signal may be understood in a more abstract way.

In the following, a more concrete example of the processing circuitry is given. In an exemplary embodiment, the processing circuitry may comprise a plurality of switches. These switches are controlled by the input signal received at the at least one communication terminal. The integrated circuit may be coupled to a component power source, for example to the car battery directly. This voltage of the component power source may be different from the supply voltage VDD described above. The supply voltage VDD may be the positive rail voltage for all circuit logic on the integrated circuit, whereas the voltage of the component power source may be the voltage provided to the electric components coupled to the output terminals of the integrated circuit. As an example, the input signals may contain the command to switch on the in-vehicle lighting. The processing circuitry may then close a switch that establishes a connection of the in-vehicle lighting to the component power source such that the in-vehicle lighting turns on. The logic in the processing circuitry and the operated switch may rely on the supply voltage VDD for their operation, whereas the in-vehicle lighting may need the voltage of the component power source to work properly. Instead of or in addition to regular switches, the integrated circuit may contain more elaborate driving components, such a pulse width modulators, which drive electric components, such as electric motors in response to the input signals received at the communication terminal(s).

The input signals received at the at least one communication terminal may be encoded messages containing specific commands, such as to close a particular switch. Depending on the nature of the communication interface, which could be a serial interface, a parallel interface or a serial-parallel interface, the decoding of these messages is done accordingly. It is also possible to have an integrated circuit with one or more so called direct drive input(s) relating directly to a particular output. The signal applied to this communication terminal or wakeup terminal may have a limited number of states, preferably two. For example, one state could indicate to the processing circuitry that the particular switch, controlled by this direct drive input, should be open, whereas a second state indicates that the particular switch should be closed. The other outputs or driven devices may then be controlled via encoded messages received at the remainder of the communication terminals and/or wakeup terminal(s). Via such a direct drive, a particularly important device driven by the integrated circuit is controlled easily by the microcontroller or communication bus controlling the integrated circuit.

In a further embodiment, the enable hold circuit comprises a standby control circuit for generating a standby request signal and feedback circuitry, the feedback circuitry being configured to process the supply voltage level indication signal and the standby request signal in generating the enable hold signal. This structure allows for a fast and reliable creation of an enable hold signal, with the enable hold functionality being interruptible via a standby request. The standby control circuit may be configured to generate the standby request signal as a response to at least one of the input signal and the wakeup signal. Such an embodiment allows to channel the inputs received at the communication terminal(s) and/or wakeup terminal(s) in one device and to implement an algorithm taking into account all accessible information for deciding whether or not to generate a standby request signal. Also, as the standby control circuit may comprise the whole standby request functionality, it may be easily adapted, should changes become necessary in the development process. The standby control circuit may comprise an enable register, with a content of the enable register being set in response to the input signal and the content of the enable register being processed in generating the standby request signal. In this enable register, the momentarily desired state, i.e. standby state or normal operation state, may be stored such that it is readily available for processing in the standby control circuit. The standby control circuit may comprise a timer circuit coupled to the at least one wakeup terminal and/or to the enable register. With this timer circuit, transition times between the standby state and the normal operation state may be effected, with the supply voltage being supplied to the integrated circuit during these transition times.

In another embodiment, the enable register is coupled to the voltage monitoring circuit, with the supply voltage level indication signal being a reset signal to the enable register.

In yet another embodiment, the enable circuit is a logic circuit, particularly an OR-gate. A logic circuit has very low power consumption. Therefore, the power dissipation of the integrated circuit in the standby state may be kept to a minimum, as the enable circuit is the only portion of the integrated circuit to be kept in an operable state when the integrated circuit as a whole is in the standby state.

The integrated circuit may further comprise a plurality of output terminals coupleable to electric components for providing power to the electric components, wherein the processing circuitry is configured to selectively provide power to the plurality of output terminals as a response to the input signal received at the at least one communication terminal. Further, the integrated circuit may be coupleable to a component power source having a component power source voltage, with the processing circuitry providing the component power source voltage to electric components out of the group consisting of lamps, LEDs, other light sources and electric motors.

While exemplary embodiments have been described, it will be understood by those skilled in the art that various changes may be made and equivalents may be substituted for elements thereof without departing from the scope of the present disclosure. In addition, many modifications may be made to adapt to a particular situation or material to the teachings of the present disclosure without departing from the scope thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit operable in a standby state, comprising:
   a wakeup terminal configured to receive a wakeup signal;
   a supply voltage terminal configured to be coupled to a supply voltage;
   a power control circuit that includes:
      an enable circuit coupled to the wakeup terminal and configured to receive the wakeup signal from the wakeup terminal and set a voltage monitoring enable signal as a response to the wakeup signal,
      a voltage monitoring circuit coupled to the supply voltage terminal and including an operation switch configured to be controlled by the voltage monitoring enable signal, wherein the voltage monitoring circuit is configured to determine if the supply voltage is above a threshold voltage and to set a supply voltage level indication signal accordingly, and
      an enable hold circuit configured to generate an enable hold signal and provide the enable hold signal to the enable circuit, wherein the enable circuit is further configured to set the voltage monitoring enable signal as a response to the enable hold signal; and
   processing circuitry configured to process an input signal and to switch between a normal operation state and a standby state of the processing circuitry in response to the supply voltage level indication signal.

2. An integrated circuit according to claim 1, further comprising a plurality of terminals wherein the wakeup terminal is a subset of the plurality of terminals.

3. An integrated circuit according to claim 1, comprising at least one communication terminal coupled to the processing circuitry and configured to receive the input signal.

4. An integrated circuit according to claim 1, wherein the wakeup terminal is a communication terminal configured to receive at least part of the input signal.

5. An integrated circuit according to claim 1, wherein the enable hold circuit comprises a timer circuit coupled to the wakeup terminal, with the timer circuit being configured to be triggered by the wakeup signal received at the wakeup terminal and the enable hold circuit being configured to set the enable hold signal in response to a status of the timer circuit.

6. An integrated circuit according to claim 5, wherein the timer circuit is configured to be additionally triggered by the input signal.

7. An integrated circuit according to claim 1, wherein the enable hold circuit comprises an enable register, wherein the enable hold circuit is configured to set a content of the enable register in response to the input signal and process the content of the enable register to generate the enable hold signal.

8. An integrated circuit according to claim 7, wherein the enable hold circuit is configured to set the content of the enable register to a value indicating a standby command by processing a standby command signal of the input signal.

9. An integrated circuit according to claim 7, wherein the enable hold circuit comprises a timer circuit coupled to the enable register, with the timer circuit being configured to be triggered by the content of the enable register having a value indicating a standby command.

10. An integrated circuit according to claim 7, wherein the enable register is coupled to the voltage monitoring circuit, the voltage monitoring circuit being configured to supply the supply voltage level indication signal as a reset signal to the enable register.

11. An integrated circuit according to claim 1, wherein the enable hold circuit comprises:
   a standby control circuit configured to generate a standby request signal; and
   feedback circuitry configured to process the supply voltage level indication signal and the standby request signal in generating the enable hold signal.

12. An integrated circuit according to claim 11, wherein the standby control circuit is configured to generate the standby request signal as a response to at least one of the input signal and the wakeup signal.

13. An integrated circuit according to claim 11, wherein the standby control circuit comprises an enable register, the standby control circuit being configured to set a content of the enable register in response to the input signal and process the content of the enable register in generating the standby request signal.

14. An integrated circuit according to claim 13, wherein the standby control circuit further comprises a timer circuit coupled to the enable register.

15. An integrated circuit according to claim 11, wherein the standby control circuit comprises a timer circuit coupled to the at least one wakeup terminal.

16. An integrated circuit according to claim 1, wherein the enable circuit is a logic circuit.

17. An integrated circuit operable in a standby state, comprising:
   a wakeup terminal configured to receive a wakeup signal;
   a supply voltage terminal configured to be coupled to a supply voltage;
   a power control circuit that includes:
      an enable circuit coupled to the wakeup terminal and configured to receive the wakeup signal from the wakeup terminal and set a voltage monitoring enable signal as a response to the wakeup signal, and
      a voltage monitoring circuit coupled to the supply voltage terminal and including an operation switch configured to be controlled by the voltage monitoring enable signal, wherein the voltage monitoring circuit is configured to determine if the supply voltage is above a threshold voltage and to set a supply voltage level indication signal accordingly;
   processing circuitry configured to process an input signal and to switch between a normal operation state and a standby state of the processing circuitry in response to the supply voltage level indication signal; and a plurality of output terminals configured to be coupled to electric components for providing power to the electric components, wherein the processing circuitry is configured to selectively provide power to the plurality of output terminals as a response to the input signal.

18. An integrated circuit according to claim 17, wherein the supply voltage terminal is configured to be coupled to a component power source having a component power source voltage as the supply voltage, the processing circuitry being configured to provide the component power source voltage to the electric components via the output terminals.

19. A system, comprising:
an electric component; and
an integrated circuit coupled to the electric component and operable in a standby state, the integrated circuit including:
at least one wakeup terminal;
a supply voltage terminal configured to be coupled to an external power source providing a supply voltage;
a power control circuit that includes:
an enable circuit coupled to the at least one wakeup terminal and configured to set a voltage monitoring enable signal as a response to a wakeup signal received at the at least one wakeup terminal,
a voltage monitoring circuit coupled to the supply voltage terminal and comprising an operation switch controlled by the voltage monitoring enable signal, wherein the voltage monitoring circuit is configured to determine if the supply voltage is above a threshold voltage and to set a supply voltage level indication signal accordingly, and
an enable hold circuit configured to generate an enable hold signal and provide the enable hold signal to the enable circuit, wherein the enable circuit is further configured to set the voltage monitoring enable signal as a response to the enable hold signal; and
processing circuitry configured to process an input signal, switch between a normal operation state and a standby state of the processing circuitry in response to the supply voltage level indication signal, and provide the electric component with power in the normal operation state.

20. The system of claim 19, wherein the enable hold circuit comprises a timer circuit coupled to the at least one wakeup terminal, with the timer circuit being configured to be triggered by the wakeup signal received at the at least one wakeup terminal and the enable hold circuit being configured to set the enable hold signal in response to a status of the timer circuit.

21. The system of claim 19, wherein the enable hold circuit comprises an enable register, wherein the enable hold circuit is configured to set a content of the enable register in response to the input signal and process the content of the enable register to generate the enable hold signal.

22. The system of claim 21, wherein the enable hold circuit further comprises a timer circuit coupled to the enable register, with the timer circuit being configured to be triggered by the content of the enable register having a value indicating a standby command.

23. The system of claim 21, wherein the enable register is coupled to the voltage monitoring circuit, the voltage monitoring circuit being configured to supply the supply voltage level indication signal as a reset signal to the enable register.

24. The system of claim 19, wherein the enable hold circuit comprises:
a standby control circuit configured to generate a standby request signal; and
feedback circuitry configured to process the supply voltage level indication signal and the standby request signal in generating the enable hold signal.

25. The system of claim 24, wherein the standby control circuit comprises an enable register, the standby control circuit being configured to set a content of the enable register in response to the input signal and process the content of the enable register in generating the standby request signal.

26. A system, comprising:
an electric component and
an integrated circuit coupled to the electric component and operable in a standby state, the integrated circuit including:
at least one wakeup terminal;
a supply voltage terminal configured to be coupled to an external power source providing a supply voltage;
a power control circuit that includes:
an enable circuit coupled to the at least one wakeup terminal and configured to set a voltage monitoring enable signal as a response to a wakeup signal received at the at least one wakeup terminal, and
a voltage monitoring circuit coupled to the supply voltage terminal and comprising an operation switch controlled by the voltage monitoring enable signal, wherein the voltage monitoring circuit is configured to determine if the supply voltage is above a threshold voltage and to set a supply voltage level indication signal accordingly;
processing circuitry configured to process an input signal, switch between a normal operation state and a standby state of the processing circuitry in response to the supply voltage level indication signal, and provide the electric component with power in the normal operation state; and
a plurality of output terminals coupled to the electric component for providing power to the electric component, wherein the processing circuitry is configured to selectively provide power to the plurality of output terminals as a response to the input signal.

27. The system of claim 26, wherein the power control circuit further includes an enable hold circuit configured to generate an enable hold signal and provide the enable hold signal to the enable circuit, wherein the enable circuit is further configured to set the voltage monitoring enable signal as a response to the enable hold signal.

28. A system, comprising:
an electric component of a group consisting of a lamp, an LED, and an electric motor; and
an integrated circuit coupled to the electric component and operable in a standby state, the integrated circuit including:
at least one wakeup terminal;
a supply voltage terminal configured to be coupled to an external power source providing a supply voltage;
a power control circuit that includes:
an enable circuit coupled to the at least one wakeup terminal and configured to set a voltage monitoring enable signal as a response to a wakeup signal received at the at least one wakeup terminal, and
a voltage monitoring circuit coupled to the supply voltage terminal and comprising an operation switch controlled by the voltage monitoring enable signal, wherein the voltage monitoring circuit is configured to determine if the supply voltage is above a threshold voltage and to set a supply voltage level indication signal accordingly; and processing circuitry configured to process an input signal, switch between a normal operation state and a standby state of the processing circuitry in response to the supply voltage level indication signal, and provide the electric component with power in the normal operation state.

29. The system of claim 28, wherein the power control circuit further includes an enable hold circuit configured to generate an enable hold signal and provide the enable hold signal to the enable circuit, wherein the enable circuit is further configured to set the voltage monitoring enable signal as a response to the enable hold signal.

* * * * *